US011109485B1

(12) United States Patent
Petrick et al.

(10) Patent No.: US 11,109,485 B1
(45) Date of Patent: *Aug. 31, 2021

(54) DUAL DYNAMIC RANDOM (DDR) ACCESS MEMORY INTERFACE DESIGN FOR AEROSPACE PRINTED CIRCUIT BOARDS

(71) Applicant: United States of America as represented by the Administrator of NASA, Washington, DC (US)

(72) Inventors: David J. Petrick, Severna Park, MD (US); Alessandro D. Geist, Bethesda, MD (US); Thomas P. Flatley, Huntington, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/874,173

(22) Filed: May 14, 2020

Related U.S. Application Data

(63) Continuation of application No. 16/142,183, filed on Sep. 26, 2018, now Pat. No. 10,667,398.

(51) Int. Cl.
*H05K 1/02* (2006.01)
*H05K 1/18* (2006.01)
(Continued)

(52) U.S. Cl.
CPC ......... *H05K 1/181* (2013.01); *H03K 19/0033* (2013.01); *H05K 1/0298* (2013.01); *H05K 1/115* (2013.01); *G06F 11/0727* (2013.01); *G06F 11/0793* (2013.01); *H05K 1/0203* (2013.01); *H05K 2201/093* (2013.01); *H05K 2201/09327* (2013.01); *H05K 2201/09509* (2013.01);
(Continued)

(58) Field of Classification Search
CPC ........... H05K 1/0298; H05K 2201/093; H05K 2201/09327; H05K 2201/10545
See application file for complete search history.

(56) References Cited

U.S. PATENT DOCUMENTS

| 4,368,503 | A | * | 1/1983 | Kurosawa | .............. | H05K 3/429 |
| | | | | | | 174/263 |
| 4,649,461 | A | * | 3/1987 | Matsuta | ............... | H05K 3/4641 |
| | | | | | | 361/799 |

(Continued)

*Primary Examiner* — Adrian S Wilson
(74) *Attorney, Agent, or Firm* — Heather Goo; Bryan A. Geurts; Helen M. Galus

(57) ABSTRACT

The present invention relates to a single board computer system with an improved memory and layout. The unique layout of the printed circuit board of the present invention allows for different parts to be placed in a back-to-back configuration to minimize the dimensions of the printed circuit board. This includes a high-performance radiation-hardened reconfigurable FPGA, for processing computation-intensive space systems, disposed on both sides of the printed circuit board. Four dual double data rate synchronous dynamic random-access memories (DDR2 SDRAMs) disposed on both the top side and on the bottom side of the printed circuit board reduce an operating voltage of said printed circuit board. A layout stack-up of the printed circuit board includes twenty-two symmetrical layers including ten ground layers, four power layers, six signal layers, a top layer, and a bottom layer.

7 Claims, 4 Drawing Sheets

(51) Int. Cl.
*H03K 19/003* (2006.01)
*H05K 1/11* (2006.01)
*G06F 11/07* (2006.01)

(52) U.S. Cl.
CPC .............. *H05K 2201/10159* (2013.01); *H05K 2201/10212* (2013.01); *H05K 2201/10522* (2013.01); *H05K 2201/10545* (2013.01)

(56) References Cited

U.S. PATENT DOCUMENTS

| | | | | |
|---|---|---|---|---|
| 5,136,471 A | * | 8/1992 | Inasaka | H01L 23/5385 174/255 |
| 5,303,119 A | * | 4/1994 | Hilbrink | H01L 23/5383 174/255 |
| 5,303,121 A | * | 4/1994 | Thornberg | H05K 1/141 174/255 |
| 5,337,219 A | * | 8/1994 | Carr | H01L 23/5385 174/255 |
| 5,888,631 A | * | 3/1999 | Sylvester | H01L 23/3735 174/256 |
| 6,021,564 A | * | 2/2000 | Hanson | H01L 21/486 257/E23.174 |
| 6,040,985 A | * | 3/2000 | Arai | H05K 1/029 174/255 |
| 6,534,723 B1 | * | 3/2003 | Asai | H01L 23/49816 174/255 |
| 7,872,876 B2 | * | 1/2011 | Koo | H05K 1/0216 361/795 |
| 9,549,467 B1 | * | 1/2017 | Petrick | H02J 1/00 |
| 9,851,763 B1 | * | 12/2017 | Petrick | H05K 1/0298 |
| 10,667,398 B1 | * | 5/2020 | Petrick | H05K 1/0218 |
| 2001/0046125 A1 | * | 11/2001 | Rehm | H01L 23/5383 361/760 |
| 2003/0198031 A1 | * | 10/2003 | Peterson | H05K 1/181 361/760 |
| 2006/0067054 A1 | * | 3/2006 | Wang | H01L 23/42 361/704 |
| 2006/0139983 A1 | * | 6/2006 | Sprietsma | H05K 1/181 365/52 |
| 2008/0078572 A1 | * | 4/2008 | Watanabe | H05K 3/4046 174/262 |
| 2009/0173520 A1 | * | 7/2009 | Duong | H05K 1/0216 174/250 |
| 2010/0045337 A1 | * | 2/2010 | Langton | G01R 31/31719 326/8 |
| 2011/0298342 A1 | * | 12/2011 | Li | G06F 1/185 312/223.2 |
| 2013/0258624 A1 | * | 10/2013 | Hardin | H05K 1/184 361/773 |
| 2016/0037631 A1 | * | 2/2016 | Payne | H05K 1/0298 174/251 |
| 2018/0088211 A1 | * | 3/2018 | Gill | G01S 7/4861 |

* cited by examiner

DUAL DYNAMIC RANDOM (DDR) ACCESS MEMORY INTERFACE DESIGN FOR AEROSPACE PRINTED CIRCUIT BOARDS

This is a continuation application of U.S. Ser. No. 16/142,183 entitled "DUAL DYNAMIC RANDOM (DDR) ACCESS MEMORY INTERFACE DESIGN FOR AEROSPACE PRINTED CIRCUIT BOARDS filed on Sep. 26, 2018 and its contents are hereby incorporated herein by reference in its entirely.

ORIGIN OF THE INVENTION

The invention described herein was at least in-part made by an employee of the United States Government and may be manufactured or used by or for the Government of the United States of American for governmental purposes without the payment of any royalties thereon or therefor.

CROSS REFERENCE TO RELATED APPLICATION

Reference is made to and the contents are hereby by incorporated by reference of non-provisional utility patent application entitled "FIRST STAGE BOOTLOADER (FSBL)."

BACKGROUND OF THE INVENTION

1. Field of the Invention

The present invention relates to an improved memory design and layout for a radiation-hardened single board computer system, useful for space applications. The printed circuit board of the present invention allows for different parts to be placed in a back-to-back configuration to minimize the dimensions of the printed circuit board. This includes a high-performance radiation-hardened reconfigurable FPGA, for processing computation-intensive space systems, disposed on both sides of the printed circuit board. Four dual double data rate synchronous dynamic random-access memories (DDR2 SDRAMs) disposed on both the top side and on the bottom side of the printed circuit board reduce an operating voltage of said printed circuit board. A layout stack-up of the printed circuit board includes twenty-two symmetrical layers including ten ground layers, four power layers, six signal layers, a top layer, and a bottom layer.

2. Description of the Related Art

While existing printed circuit boards used in space applications, such as the SpaceCube 2.0™ processor card, have been employed and have been successful in many space missions, the present double data rate synchronous dynamic random-access memory (DDR1 SDRAM) memories are currently several generations behind, and as a result, the DDR1 SDRAM memory dies that had been radiation tested and qualified, have reached end of life.

Further, present DDR designs have memory systems used in space instruments, which are too slow for these applications. Another problem is that to accommodate any upgrades from present DDR designs requires different interface signals, pinouts, and voltage requirements, complicating any significant changes to the present printed circuit board layout. Changing the memory technology will have severe impact on the printed circuit board design since the original SpaceCube 2.0™ design utilizes DDR1 SDRAMs for its volatile memories.

Accordingly, since the present DDR1 SDRAM memories are no longer appropriate or available, an improvement in memory is required for space applications such that even greater amounts of science data can be produced, particularly since space applications require even more memory bandwidth for on-board processing, especially for many image processing applications.

SUMMARY OF THE INVENTION

The present invention relates to an improved memory design and layout for a radiation-hardened single board computer system, useful for space applications.

In one embodiment, the single printed circuit board computer system of the present invention (such as a SpaceCube 2.0™ processor card or the like) is constrained to a small system that requires significant data processing capability and is built with radiation tolerant and/or hardened space parts. In one embodiment, the single board computer system is configured to execute at least 3,000 millions of instructions per second (MIPS), which is more than ten times greater than other comparable space processors.

In one embodiment, the present invention relates to a single board computer system with an improved memory and layout. In one embodiment, the unique layout of the printed circuit board of the present invention allows for different parts to be placed in a back-to-back configuration to minimize the dimensions of the printed circuit board. This includes a high-performance radiation-hardened reconfigurable FPGA, for processing computation-intensive space systems, disposed on both sides of the printed circuit board. Four dual double data rate synchronous dynamic random-access memories (DDR2 SDRAMs) disposed on both the top side and on the bottom side of the printed circuit board reduce an operating voltage of said printed circuit board. A layout stack-up of the printed circuit board includes twenty-two symmetrical layers including ten ground layers, four power layers, six signal layers, a top layer, and a bottom layer.

In one embodiment, the present invention a radiation-hardened single board computer system, includes: a printed circuit board having a top side and a bottom side, the printed circuit board including a plurality of layers arranged symmetrically in a two-halves configuration above and below a central plane of the printed circuit board, the printed circuit board including: a first field programmable gate array (FPGA) processor device disposed on the top side and a second FPGA disposed on the bottom side of the printed circuit board; four dual double data rate synchronous dynamic random-access memories (DDR2 SDRAMs) disposed on the top side of the printed circuit board; and four DDR2 SDRAMs disposed on the bottom side of the printed circuit board and mirroring the four DDR2 SDRAMs disposed on the top side of the printed circuit board; wherein the four DDR2 SDRAMs on the top side and the four DDR2 SDRAMs disposed on the bottom side of the printed circuit board store an operating system and dynamic application data; and a plurality of peripheral components mounted on the top side and the bottom side.

In one embodiment, a layout stack-up of the printed circuit board includes twenty-two symmetrical layers including ten ground layers, four power layers, six signal layers, a top layer, and a bottom layer.

In one embodiment, the plurality of peripheral components mounted on the top side of the printed circuit board include a flash memory device, a programmable read only memory device, at least one voltage regulator, a third FPGA which controls a central portion of the printed circuit board, and at least one electrical interface.

In one embodiment, the plurality of peripheral components mounted on the bottom side of the printed circuit board include a flash memory device, a multiplexer, and at least one electrical interface.

In one embodiment, the eight DDR2 SDRAMs reduce an operating voltage of the printed circuit board.

In one embodiment, the at least one voltage regulator is a Buck Converter.

In one embodiment, the third FPGA includes internal scrubbing and error correction and detection (EDAC) methods to correct errors in processing operations of the printed circuit board.

In one embodiment, a radiation-hardened single board computer system includes: a printed circuit board having a top side and a bottom side, the printed circuit board including a plurality of layers arranged symmetrically in a two-halves configuration above and below a central plane of the printed circuit board; a field programmable gate array (FPGA) processor device disposed on the top side and on the bottom side of the printed circuit board; at least one connector disposed on the top side; and a plurality of peripheral components mounted on the top side and the bottom side; wherein a layout stack-up of the top side of the printed circuit board includes upward from the central plane: a first ground layer; a first signal layer disposed on the first ground layer; a second ground layer disposed on the first signal layer; a second signal layer disposed on the second ground layer; a third ground layer disposed on the second signal layer; a third signal layer disposed on the third ground layer; a fourth ground layer disposed on the third signal layer; a first power layer disposed on the fourth ground layer; a second power layer disposed on the first power layer; a fifth ground layer disposed on the second power layer; and a top layer disposed on the fifth ground layer.

In one embodiment, the layout stack-up of the bottom side of the printed circuit board from the center plane outward includes: a sixth ground layer; a fourth signal layer disposed on the sixth ground layer; a seventh ground layer disposed on the fourth signal layer; a fifth signal layer disposed on the seventh ground layer; an eighth ground layer disposed on the fifth signal layer; a sixth signal layer disposed on the eighth ground layer; a ninth ground layer disposed on the sixth signal layer; a third power layer disposed on the ninth ground layer; a fourth power layer disposed on the third power layer; a tenth ground layer disposed on the fourth power layer; and a bottom layer disposed on the tenth ground layer.

In one embodiment, a multi-layer printed circuit board for a single radiation hardened processing system includes: a top half; a bottom half; and a central plane therebetween; wherein the multi-layer printed circuit board includes a plurality of layers arranged symmetrically in a two-halves configuration above and below the central plane of the printed circuit board; and a layout stack-up of the multi-layer printed circuit board, the layout stack-up including: four top ground layers and three top signal layers disposed in alternating layers in a top half above the central plane, of the printed circuit board; four bottom ground layers and three bottom signal layers disposed in alternating layers in a bottom half below the central plane, of the printed circuit board; a pair of top power layers disposed on each other, and disposed under a top layer of the top half of the printed circuit board; a pair of bottom power layers disposed on each other, and disposed under a bottom layer of the bottom half of the printed circuit board; and a fifth top ground layer disposed between the pair of top power layers and the top layer of the printed circuit board; a fifth bottom ground layer disposed between the pair of bottom power layers and the bottom layer of the printed circuit board; wherein the top layer of the top half and the bottom layer of the bottom half each include a plurality of land pads for connecting electrical components to the printed circuit board.

In one embodiment, a layout stack-up of the top side of the printed circuit board includes upward from the central plane includes: a first top ground layer of the four top ground layers; a first top signal layer of the three top signal layers, the first top signal layer being disposed on the first top ground layer; a second top ground layer of the four top ground layers, the second top ground layer being disposed on the first top signal layer; a second top signal layer of the three top signal layers, the second top signal layer being disposed on the second top ground layer; a third top ground layer of the four top ground layers, the third top ground layer being disposed on the second top signal layer; a third top signal layer of the three top signal layers, the third top signal layer being disposed on the third top ground layer; a fourth top ground layer of the four top ground layers, the fourth top ground layer being disposed on the third top signal layer; a first top power layer of the pair of power layers, the first top power layer being disposed on the fourth top ground layer; and a second top power layer of the pair of power layers, the second top power layer being disposed on the first top power layer; wherein the fifth top ground layer is disposed on the second top power layer; and wherein the top layer of the top half is disposed on the fifth top ground layer.

In one embodiment, the layout stack-up of the bottom side of the printed circuit board from the center plane outward includes: a first bottom ground layer of the four bottom ground layers; a first bottom signal layer of the three bottom signal layers, the first bottom signal layer being disposed on the first bottom ground layer; a second bottom ground layer of the four bottom ground layers, the second bottom ground layer being disposed on the first bottom signal layer; a second bottom signal layer of the three bottom signal layers, the second bottom signal layer being disposed on the second bottom ground layer; a third bottom ground layer of the four bottom ground layers, the third bottom ground layer being disposed on the second bottom signal layer; a third bottom signal layer of the three bottom signal layers, the third bottom signal layer being disposed on the third bottom ground layer; a fourth bottom ground layer of the four bottom ground layers, the fourth bottom ground layer being disposed on the third bottom signal layer; a first bottom power layer of the pair of bottom power layers, the first bottom power layer being disposed on the fourth bottom ground layer; and a second bottom power layer of the pair of bottom power layers, the second bottom power layer being disposed on the first bottom power layer; wherein the fifth bottom ground layer is disposed on the second bottom power layer; and wherein the bottom layer of the bottom half is disposed on the fifth bottom ground layer.

In one embodiment, the multi-layer printed circuit board further includes: a plurality of blind vias and a plurality of through-vias to connect similarly located pins in a back-to-back arrangement.

In one embodiment, a multi-layer printed circuit board for a single board radiation hardened processing system, the multi-layer printed circuit board including: a top half; a bottom half; and a central plane therebetween; wherein the multi-layer printed circuit board includes a plurality of layers arranged symmetrically in a two-halves configuration above and below the central plane of the printed circuit board; and a layout stack-up of the multi-layer printed circuit board, the layout stack-up including: four top ground layers and three top signal layers disposed in alternating layers in a top half above the central plane, of the printed circuit board; four bottom ground layers and three bottom signal layers disposed in alternating layers in a bottom half below the central plane, of the printed circuit board; a pair of top power layers disposed on each other, and disposed under a top layer of said top half of the printed circuit board; a pair of bottom power layers disposed on each other, and disposed under a bottom layer of the bottom half of the printed circuit board; and a fifth top ground layer disposed between the pair of top power layers and the top layer of the printed circuit board; a fifth bottom ground layer disposed between the pair of bottom power layers and the bottom layer of the printed circuit board; wherein the top layer of the top half and the bottom layer of the bottom half each include a plurality of land pads for connecting electrical components to the printed circuit board; a field programmable gate array (FPGA) processor device disposed on a top side and on a bottom side of the multi-layer printed circuit board; at least one connector disposed on the top side; and a plurality of peripheral components mounted on the top side and on a bottom side of the multi-layer printed circuit board; and wherein the top layer of the top half and the bottom layer of the bottom half each include a plurality of land pads for connecting electrical components to the printed circuit board.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The descriptions of the drawings are only one exemplary embodiment of the disclosure and not to be considered as limiting in scope.

DESCRIPTION OF THE INVENTION

The present invention relates to an improved memory design and layout for a radiation-hardened single board computer system, useful for space applications.

In one embodiment, the single printed circuit board computer system 100 (such as a SpaceCube 2.0™ processor card or the like) is constrained to a small system that requires significant data processing capability and is built with radiation tolerant and/or hardened space parts. In one embodiment, the single board computer system 100 is configured to execute at least 3,000 millions of instructions per second (MIPS), which is more than ten times greater than other comparable space processors.

Figure 1:
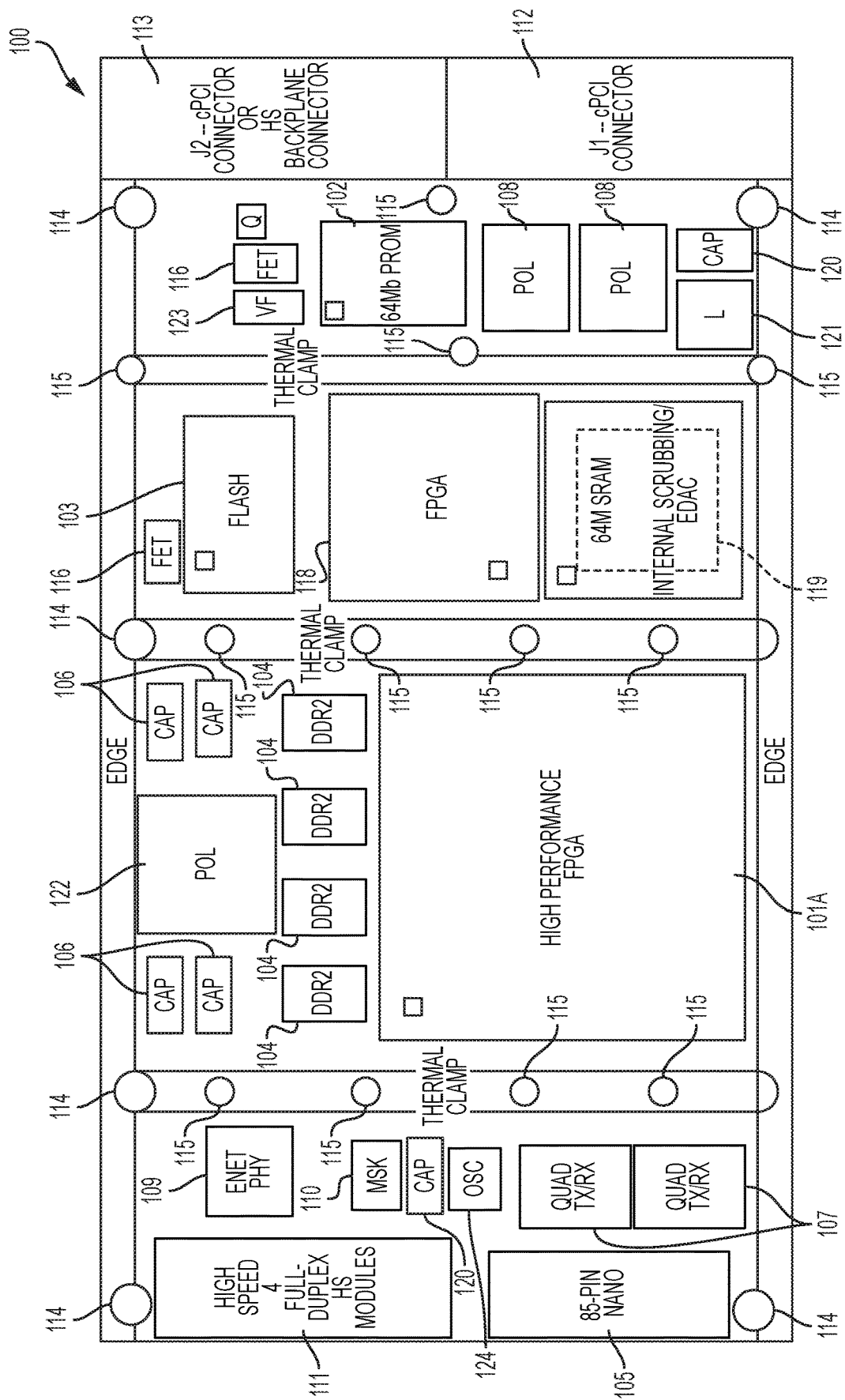
FIG. 1 is a schematic diagram of a top layout of a radiation-hardened single board computer system, useful for space applications, according to one embodiment consistent with the present invention.
Figure 2:
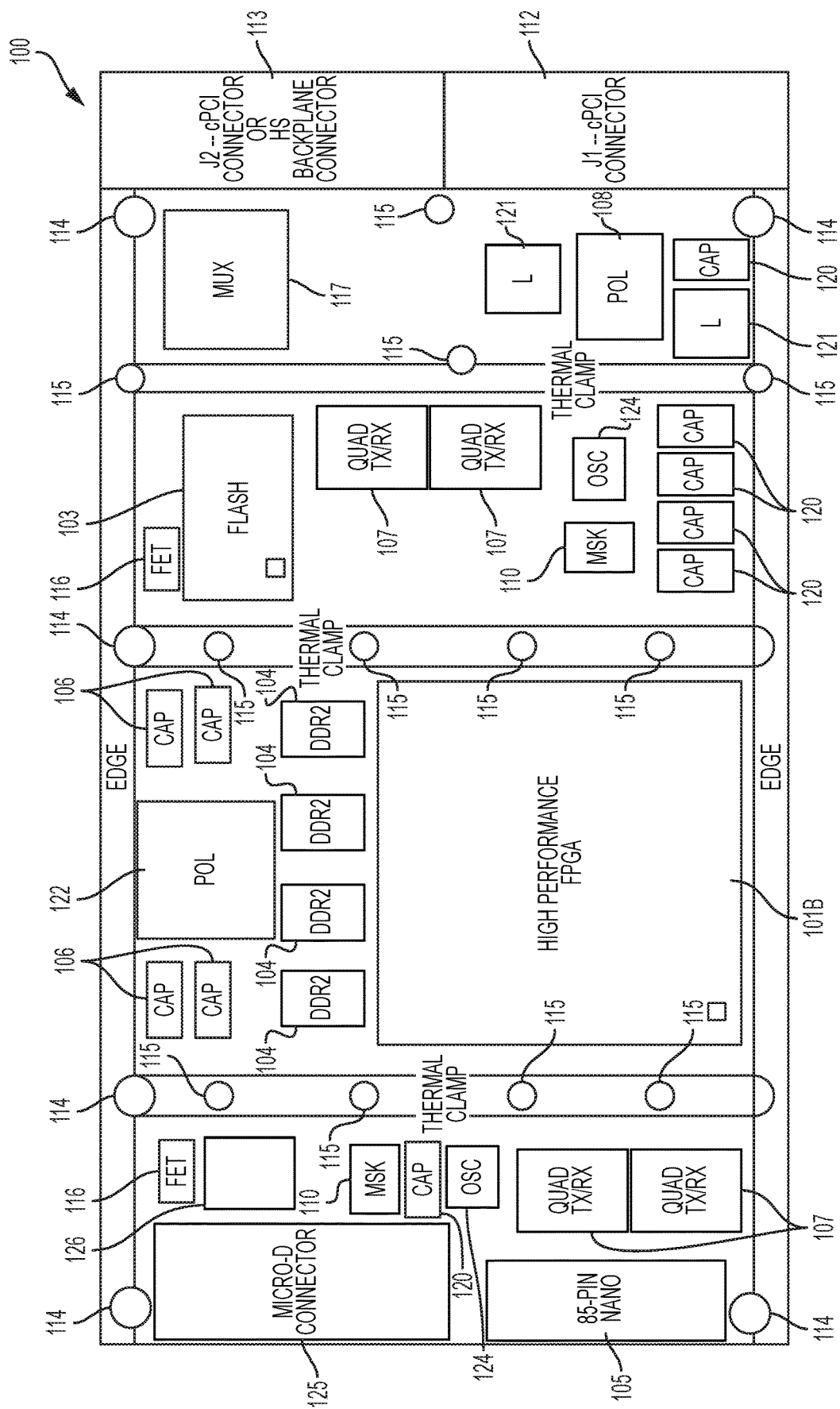
FIG. 2 is a schematic diagram of a bottom layout of the single board computer system of FIG. 1, according to one embodiment consistent with the present invention.

In one embodiment, the present invention relates to a radiation-hardened single board computer system 100 with an improved memory and layout (see FIGS. 1-2). In one embodiment, the unique layout of the printed circuit board of the present invention allows for different parts to be placed in a back-to-back configuration to minimize the dimensions of the printed circuit (wiring) board.

Although the embodiments disclosed herein will be described with reference to the drawings, it should be understood that the embodiments disclosed herein can be embodied in many alternate forms. In addition, any suitable size, shape or type of elements, components, or materials could be used.

In one embodiment, the single board computer system 100 (see FIGS. 1-2) of the present invention includes an extremely small, low power, reconfigurable field-programmable gate array (FPGA) multi-processor system 101A, 101B, such as a Xilinx Virtex-5, or the like, suitable for space flight. In one embodiment, the FPGA 101A, 101B of the printed circuit board of the present invention is a high-performance radiation-hardened reconfigurable FPGA for processing computation-intensive space systems. While embodiments of the present invention are generally described with respect to the FPGA, they are no so limited, and any suitable reconfigurable processor that meets the desired strict size, weight, processing capability and power requirements, can be implemented in the single board computer system 100.

In one embodiment, peripheral components or devices that are used with the single board computer system 100 are chosen to maximize the use of the system 100 with a small electronics or printed circuit board. As shown in FIG. 1, which illustrates the top side of the single board computer system 100, and FIG. 2, which illustrates the bottom side of the single board computer system 100 (as seen from the top), peripheral devices or components are used with the single board computer system 100 to maximize use of the system 100. The capacities of the peripheral components referenced herein are merely exemplary, and in alternate embodiments, any suitable capacity devices can be used.

In one embodiment, the peripheral devices or components include a programmable read-only memory (PROM) device 102 for configuring the FPGA 101A, such as a 64 Mb PROM 102, and at least one flash memory device 103, such as a 32 Gb flash memory for holding the software application and other user data. In one embodiment, there is a flash memory device 103 (i.e., such as a 3D PLUS 64 Mb Flash device) on each of the top and bottom of the printed circuit board 100.

In one embodiment, the single board computer system 100 includes a plurality of double data rate synchronous dynamic random-access memories (DDR2 SDRAMs) 104 (such as an ISSI® DDR2 SDRAMSs or the like), suitable to extend the life of the design of the present invention and provide even greater memory throughput to support the next generation of instruments. In order to accommodate the DDR2 SDRAMs devices 104, which have different interface signals, pinouts, and voltage requirements, a significant change to the layout of the printed circuit board was required, and a unique layout of the single board computer system 100 is utilized in the present invention.

Figure 3:
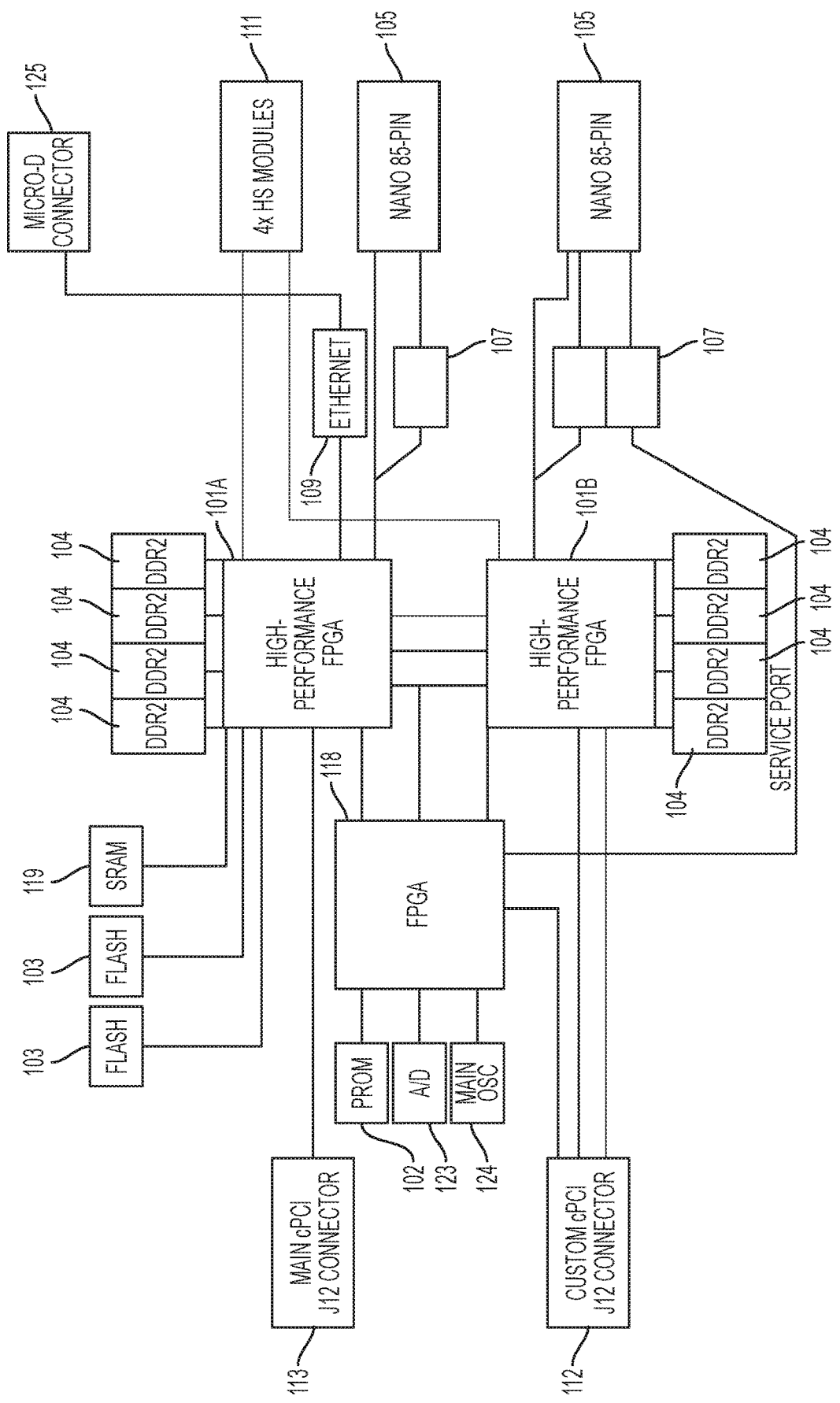
FIG. 3 is a schematic diagram of the communication links or interfaces between the major components of the single board computer system of FIGS. 1-2, according to one embodiment consistent with the present invention.

In one embodiment, the present invention includes the optimal configuration of grouping the DDR2 SDRAMs memories 104 in pairs with shared address/command/control lines, and a shared clock (see FIG. 3 for interfaces). In one embodiment, the DDR2 SDRAM random-access-memories 104 includes two sets of 4x DDR2 SDRAM 2 Gbit (×16) memories 104 connected to the FPGA 101A (top side—see FIG. 1) and FPGA 101B (bottom side—see FIG. 2). In other words, four 2 Gbit DDR2s SDRAMs 104 on each of the top side and on the bottom side of the board 100 for a total of 8 DDR2 SDRAMs 104, for storing an operating system and dynamic application data such as images or attached instrument data, for example.

By sharing the address/clock/command/control lines, the number of FPGA 101A, 101B input/outputs for the DDR2 SDRAMs 104 interfaces can be reduced. This allows more of the FPGA input/outputs to be available for other interfaces, increasing the card's 100 flexibility. In one embodiment, the total input/output (I/O) is equal to 130 pins (2×65) per FPGA 101A, 101B, with shared address/clock/command/control.

In one embodiment, the use of DDR2 SDRAMSs 104 has the advantage of reducing the operating voltage from previous 2.5V to 1.8V, which reduces the power from the perspective of thermal analysis. In one embodiment, the estimated power is 186 mA per DDR2 SDRAM module 104 of power, and 1.488 A @ 1.8V total current.

In one embodiment, signal integrity analysis showed that the FPGA 101A, 101B could drive the address/command/control lines to dual memories (i.e., DDR2 SDRAMs 104) while meeting the switching requirements. Signal integrity and power analysis were also used to determine which termination schemes were required to meet the performance requirements. This was important because some of the termination schemes required additional regulators (which cannot be added due to size constraints) or an increase in power consumption on the board.

In one embodiment, the present invention utilizes a dedicated regulator 122, such as a Texas Instruments Point-of-Lead DC/DC Buck Converter or the like, for the DDR2 SDRAM memories 104 and for making changes to the power planes in the printed circuit board. In one embodiment, the DDR2 SDRAM module 104 Buck Converter 122 provides a synchronous step-down DC/DC converter capable of driving up to a 2 A load with efficiency and output accuracy for a very small solution size.

In one embodiment, the DDR2 SDRAM modules 104 of the present invention improve support for new space instruments because they can provide more than a 2× memory speed increase over previous designs.

Other peripheral components of the single board computer system are generally disclosed in U.S. Pat. No. 9,851,763 which is herein incorporated by reference.

In one embodiment, besides the FPGAs 101A, 101B, the PROM 102, the flash memory device 103, and the DDR2 SDRAMs 104, other major peripheral components on the top side of the single board computer system 100 include a plurality of capacitors 106. With the configuration of the DDR2 SDRAMs 104 in the present single board computer system 100, which allows additional area on the printed circuit board to be available for use, large capacitors 106 can be implemented to provide instantaneous current during the enable of on-die termination (ODT) or terminal resistance internal to the DDR2 SDRAM devices 104.

In one embodiment, the single board computer system 100 includes an FPGA device 118 (such as an Aeroflex FPGA Model UT6325 or the like) which controls the main part of the printed circuit board 100 and programs the FPGA 101. In one embodiment, an SDRAM 119 with internal scrubbing (such as an Aeroflex 64M SDRAM Model UT8ER2M32, with internal scrubbing EDAC, or the like) is provided on the top side of the board 100 to automatically correct any errors in the processing operations of the printed circuit board 100.

In one embodiment, the top side of the printed circuit board 100 includes a field-effect-transistor (FET) 116. At the peripheral sides of the printed circuit board 100, the present invention includes a plurality of transmit/receive devices 107 which assist in communications or provide for custom interfaces. In one embodiment, the printed circuit board 100 includes a voltage regulator 110, a capacitor 120, an oscillator 124, an ethernet connection 109, and a communication module 111 (such as an Airborn high-speed 4 full-duplex high-speed module, or the like).

In one embodiment, another peripheral component is a connector (such as an Airborn 85-pin Nano connector, or the like), one connector 105 on the top and another connector 105 on the bottom of the board 100 in back-to-back configuration. The connectors are surface mount connectors 105, but any suitable connectors can be used that provides the required functionality while minimizing space and weight. The connectors 105 are configured to provide any suitable connections or ports for the single board computer system 100, which include, for example, a power connection which can provide a 5-volt power supply, depending on the requirements of the single board computer system 100.

In one embodiment, other peripheral components include a plurality of point-of-load (POL) DC-DC converters 108, another FET 116, inductors 121, capacitors 120, and a voltage-to-frequency (A/D) converter 123. In one embodiment, the POL converters 108 generate necessary power for the circuit board 100. The inductors 121 are required to be used in conjunction with the Buck POL regulators 122 to generate the required voltages. The capacitors 120 are required for power filtering and the overall power distribution network. The MOSFETs 116 are used to switch power on and off to select circuitry on the board 100. The voltage-to-frequency (VF) converter 123 is used for monitoring various circuit card voltages and temperatures (for housekeeping purposes).

In one embodiment, other peripheral components include a compact peripheral component interconnect (cPCI) 112 or computer bus 112, and a second cPCI 113 high-speed backplane connector. The cPCI connector 112 is used to plug the card 100 into a higher-level assembly as a daughter card configuration.

The single board computer system 100 of the present invention, and its components, as described above, improve the underlying technology of the memory system and its layout, which makes it useful for space applications.

In alternate embodiments, the peripheral components can include such other components as needed to support the user application of the single board computer system 100 that satisfy the requirements as generally described herein.

In one embodiment, mounting holes 114 are used to secure the connector 111, or the component computer bus 112 to the circuit board. In one embodiment, other through holes 115 or thermal board interfaces or mounting holes are provided for securing or clamping the single board computer system 100 within a suitable frame or connector structure and for providing stiffness to the solder joints of the column grid array FPGA devices (this is needed for fighting solder joint fatigue in an environment where temperature is constantly changing). In one embodiment, the thermal board interfaces or mounting holes 115 can provide a primary heat path from the circuit board to the frame or other heat sink. In one embodiment, a secondary heat path would involve stalling a thermal strap or bond from the packaging of the higher power devices to the heat sink, such as the FPGAs 101A, 101B and DDR2 SDRAMs 104.

In one embodiment, on the bottom side of the single board computer system 100 (see FIG. 2), like reference numerals indicate like components from the top side of the printed circuit board. In one embodiment, peripheral parts or components mounted to the bottom side include a multiplexer (Mux) 117 (such as an Aeroflux Mux or the like), additional capacitors 106, 120, an addition inductor 121, ethernet transformer 126, oscillator 124, additional transmit/receive devices 107, and a communication module, such as a micro-D connector 125 in place of the high speed 4 full-duplex module 111 in the top side of the board 100.

In alternate embodiments, the back side of the single board computer system 100 can include such other suitable components and devices as required for the particular user application and that satisfy the requirements as generally described herein.

In one embodiment, the interfaces between the main components of the single board computer system 100 are shown in FIG. 3, which accomplish the functions of the present system 100. In one embodiment, four DDR2 SDRAMs 104, flash memories 103 and SRAM 119 are connected to FPGA 101A, and the other four DDR2 SDRAMs 104 are connected to the FPGA 101B. Both FPGAs 101A, 101B are connected to each other, and to FPGA 118, as well as to transmitter/receivers 107—to which FPGA 118 is also connected. FPGA 101A has an ethernet 109 connection. FPGA 118 connects to PROM 102, A/D converter 123, and main oscillator 124. FPGA 101A is connected to the main cPCI J1 connector 113, and the nano 85-pin connector 105 (top side), and FPGA 101B is connected to the custom cPCI J2 connector 112, and the nano 85-pin connector 105 (bottom side). FPGA 118 is also connected to the bottom side nano 85-pin connector 105. Finally, the ethernet connection 109 is connected to the micro-D connector 125 (bottom side). The interfaces of the single board computer system 100 of the present invention, improve the underlying technology of the memory system and its layout, which makes it useful for space applications.

In one embodiment, the single printed circuit board computer system 100 (such as a SpaceCube 2.0™ processor card or the like) is constrained to a small system that requires significant data processing capability and is built with radiation tolerant and/or hardened space parts. In one embodiment, the single board computer system 100 is configured to execute at least 3,000 millions of instructions per second (MIPS), which is more than ten times greater than other comparable space processors.

In one embodiment, radiation mitigation is possible with the single board computer system 100 of the disclosed embodiment, by using radiation-hardened parts and components. In one embodiment, the software and data files in the flash memory can be stored in a redundant fashion to protect against radiation upsets. In one embodiment, the single board computer system 100 is reconfigurable via a "hardware bootloader".

Figure 4:
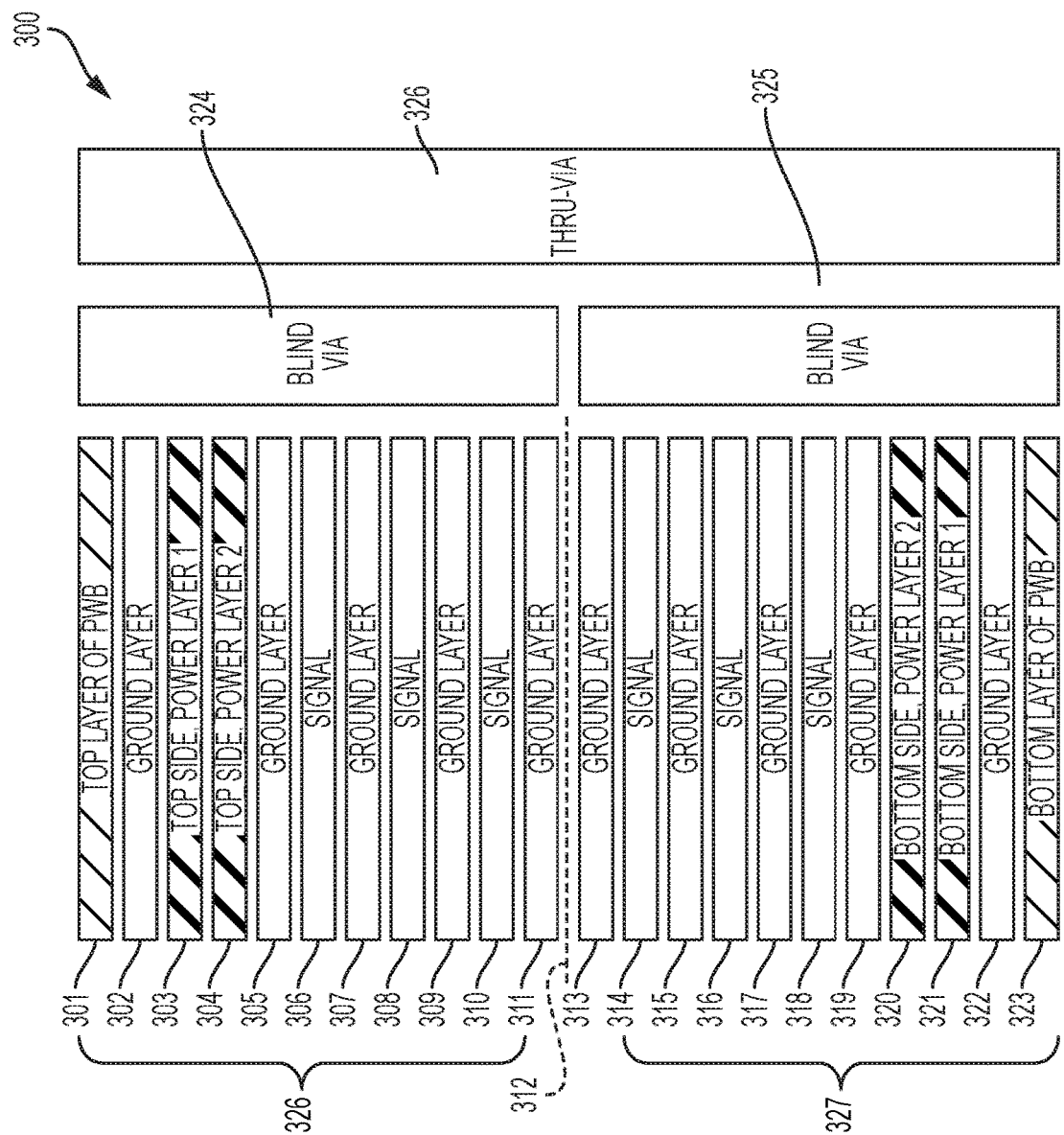
FIG. 4 is a schematic diagram of two-halves of the printed circuit board layout stack-up for a system utilizing FIGS. 1-2, according to one embodiment consistent with the present invention.

In one embodiment, the stack-up layout of the single board computer system 100 or electronic/printed circuit board (PCB) (see FIG. 4), are arranged symmetrically around a central plane 301 which is co-planar with the PCB 300. The PCB 300 is a multi-layer PCB 300 configured in a two halves configuration. The PCB 300 includes a center of the board 312, a top half 326 and a bottom half 327, which includes a multi-layer configuration which supports back-to-back mounting of similar column grid array (CGA) devices, where the layers of the PCB 300 are arranged symmetrically around the central plane 312, which is coplanar with the PCB 300. The top layer 301 and the bottom layer 323 of the PCB 300 can have the same configuration as each other, mirrored around the central plane 312. The top layer 301 and bottom layer 323 in the layout 300 include the mounting or land pads for connecting electronic components to the PCB 300 as well as signal geometry of the conductive material and insulating layers formed on or within the PCB 300.

The stack-up layout 300 incudes 22 layers: ten ground layers 302, 304, 307, 309, 313, 315, 316, 318, 319, 322; four power layers 303, 304, 320, 321; six signal layers 306, 308, 310, 314, 316, 317; and top layer 301 and bottom layer 323. The power planes are sandwiched by ground layers so that the power planes are not used as signal references. The power planes 303, 304, 320, 321 are placed near the top and bottom of the stack-up to reduce impedance of the power distribution network. The stack-up layout 300 allows the present invention to improve the underlying technology of the memory system, which makes it useful for space applications.

The stack-up layout 300 also includes vias 324, 325 and through-hole via 326. With the two-halves board configuration shown in layout 300, many of the via-in-pad features require only blind vias 324, 325 going no more than halfway through the board 300 allowing a smaller via diameter to be used. A through via 326 is used to connect similarly located pins on each of the devices in a back-to-back configuration of CGA devices.

In one embodiment, using the present FPGAs 101A, 101B, all power/signal vias will be blind vias, with the exception of the FPGA I/O that are simply a via.

In one embodiment, the single board computer system 100 of the present invention is used in space applications, such as the SpaceCube 2.0™, a very small miniaturized system used in robotic arms or international space station payloads or satellites for space research applications. Other applications include, but are not limited to, systems used in small free flyer satellite systems, balloons, sounding rockets, unmanned aerial vehicles (UAVs), and small instruments that require high end data processing.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A radiation-hardened single board computer system for operation in a space environment, the radiation-hardened single board computer system comprising:
  a printed circuit board having a top side and a bottom side, said printed circuit board including a plurality of layers arranged symmetrically in a two-halves configuration above and below a central plane of said printed circuit board, said printed circuit board including:
    a first radiation tolerant field programmable gate array (FPGA) processor device disposed on said top side and a second radiation tolerant FPGA disposed on said bottom side of said printed circuit board,
    four radiation tolerant dual double data rate synchronous dynamic random-access memories (DDR2 SDRAMs) disposed on said top side of said printed circuit board and
    four DDR2 SDRAMs disposed on said bottom side of said printed circuit board and mirroring said four DDR2 SDRAMs disposed on said top side, wherein said four DDR2 SDRAMs on said top side and said four DDR2 SDRAMs disposed on said bottom side of said printed circuit board store an operating system and dynamic application data, and
    a plurality of peripheral components mounted on said top side and said bottom side,
  wherein a layout stack-up of said top side of said printed circuit board comprises:
    a first ground layer;
    a first signal layer disposed on said first ground layer;
    a second ground layer disposed on said first signal layer;
    a second signal layer disposed on said second ground layer;
    a third ground layer disposed on said second signal layer;
    a third signal layer disposed on said third ground layer;
    a fourth ground layer disposed on said third signal layer;
    a first power layer disposed on said fourth ground layer;
    a second power layer disposed on said first power layer;
    a fifth ground layer disposed on said second power layer; and
    a top layer disposed on said fifth ground layer.

2. The single board computer system of claim 1, wherein a layout stack-up of the printed circuit board includes at least twenty-two symmetrical layers including ten ground layers, four power layers, six signal layers, a top layer, and a bottom layer.

3. The single board computer system of claim 2, wherein said plurality of peripheral components mounted on said top side of said printed circuit board include a flash memory device, a programmable read only memory device, at least one voltage regulator, a third FPGA which controls a central portion of said printed circuit board, and at least one electrical interface.

4. The single board computer system of claim 2, wherein said plurality of peripheral components mounted on said bottom side of said printed circuit board include a flash memory device, a multiplexer, and at least one electrical interface.

5. The single board computer system of claim 1, wherein said eight DDR2 SDRAMs reduce an operating voltage of said printed circuit board.

6. The single board computer system of claim 3, wherein said at least one voltage regulator is a Buck Converter.

7. The single board computer system of claim 3, wherein said third FPGA includes internal scrubbing and error correction and detection (EDAC) methods to correct errors in processing operations of the printed circuit board.

* * * * *